United States Patent [19]

Kamiya

[11] Patent Number: 5,550,633
[45] Date of Patent: Aug. 27, 1996

[54] OPTICAL MEASURING APPARATUS HAVING A PARTITIONING WALL FOR DIVIDING GAS FLOW IN AN ENVIRONMENTAL CHAMBER

[75] Inventor: Saburo Kamiya, Yokohama, Japan

[73] Assignee: Nikon Corporation, Tokyo, Japan

[21] Appl. No.: 334,059

[22] Filed: Nov. 4, 1994

[30] Foreign Application Priority Data

Nov. 10, 1993 [JP] Japan .................. 5-280788

[51] Int. Cl.⁶ .................................. G01B 9/02
[52] U.S. Cl. ............................. 356/358; 356/345
[58] Field of Search .................... 356/358, 345; 355/30

[56] References Cited

U.S. PATENT DOCUMENTS 4,989,031  1/1991  Kamiya ..................... 355/30

OTHER PUBLICATIONS

English Abstract of Japanese Patent Application Laid–Open No. 2–1505 dated Jan. 5. 1990.

*Primary Examiner*—Samuel A. Turner
*Assistant Examiner*—Amanda Merlino
*Attorney, Agent, or Firm*—Shapiro and Shapiro

[57] ABSTRACT

An optical measuring apparatus includes an environmental chamber which has a blowing opening to which a temperature-controlled gas is supplied from an external device and an exhaust opening for exhausting the air outside the environmental chamber, a light-emitting unit for irradiating a light beam onto an object to be measured arranged in the environmental chamber, a light-receiving unit for receiving the light beam reflected by the object to be measured, and outputting a signal corresponding to a position of the object to be measured. A heat source is provided in the environmental chamber and forms an air layer having a temperature higher than the gas immediately after the gas is supplied from the blowing opening. There is provided a partitioning wall which is arranged between an optical path of the light beam and the heat source to divide a flow of the gas.

17 Claims, 3 Drawing Sheets

OPTICAL MEASURING APPARATUS HAVING A PARTITIONING WALL FOR DIVIDING GAS FLOW IN AN ENVIRONMENTAL CHAMBER

BACKGROUND OF THE INVENTION

1. Field of the Invention

The present invention relates to a high-precision optical measuring apparatus arranged in, e.g., an environmental chamber. More particularly, the present invention is suitably applied to, e.g., a laser interferometric measuring device for measuring the coordinate position of a stage which is aligned with high precision in, e.g., a semiconductor exposure apparatus, a reticle coordinate measuring machine, or the like arranged in an environmental chamber.

2. Related Background Art

For example, in the manufacture of a semiconductor element by a photolithography process, an exposure apparatus for exposing a pattern image on a photomask or reticle (to be generally referred to as a "reticle" hereinafter) onto a wafer coated with a photoresist is used. In such an exposure apparatus, since the wafer must be aligned with high precision, the coordinate position of a stage for aligning the wafer is measured by a laser interferometric measuring device. The precision of a pattern formed on the reticle influences the yield of semiconductor elements formed by transferring this pattern. For this reason, a reticle coordinate measuring machine for measuring the pattern on the reticle is used. In the reticle coordinate measuring machine as well, the coordinate position of a stage for moving the reticle is measured with high precision by a laser interferometric measuring device.

Normally, such a semiconductor exposure apparatus, a reticle coordinate measuring machine, or the like is arranged in an environmental chamber connected to a high-precision air-conditioning apparatus. The following description will be made while using a semiconductor exposure apparatus as an example. The air-conditioning apparatus for the environmental chamber in which the semiconductor exposure apparatus is arranged has three main functions. The first function is to maintain cleanliness of the entire semiconductor exposure apparatus at a predetermined level, and the second function is to maintain the apparatus at a constant temperature. The third function is to suppress a variation in refractive index of the air which influences the precision of the above-mentioned laser interferometric measuring device and other optical sensors. The present invention mainly relates to this third function.

In the laser interferometric measuring device, a variation in refractive index of the optical path of a measurement beam is an error factor. More specifically, when the refractive index of the air varies due to a variation in temperature of the air, the length-measurement precision suffers. The rate of change in refractive index of the air with respect to a unit change in temperature is about −1 ppm/° C. In this case, when the distance to be measured is assumed to be about 300 mm, a measurement error upon a variation in refractive index of the air is about 0.3 μm per 1° C.

For example, in the case of the next-generation semiconductor exposure apparatus which can manufacture 64M DRAMs, the measurement precision required for a laser interferometric measuring device for a wafer stage is about 0.01 μm. For this reason, the temperature fluctuation of the air must be suppressed to be about 0.03° C. or less. In order to reduce the temperature fluctuation of the air, the prior art pays attention to the performance of the air-conditioning apparatus for the environmental chamber, i.e., the temperature control performance of the air-conditioning apparatus is improved, and temperature nonuniformities at a supply opening of the air, from the air-conditioning apparatus, in the environmental chamber are reduced. In the case of the semiconductor exposure apparatus, an anti-dust HEPA filter (High Efficiency Particulate Air Filter) is arranged at a blowing opening of the environmental chamber.

In the above-mentioned prier art, especially in the semiconductor exposure apparatus, the HEPA filter is arranged at the blowing opening of the environmental chamber. For this reason, the fluctuation of the refractive index of the air itself immediately after the air is supplied from the blowing opening into the environmental chamber is very small. However, the fluctuation of the refractive index of the air gradually increases before the air supplied via the HEPA filter at the blowing opening reaches the optical path of the laser interferometric measuring device. As a result, a considerable variation in refractive index occurs in the optical path of the laser interferometric measuring device, resulting in poor measurement precision.

In this case, the dominant variation factor of the refractive index is temperature. Causes of a variation in temperature of the air include generation of a temperature fluctuation in a boundary layer, and diffusion of heat by convection transportation. More specifically, since the temperatures of metal members in the semiconductor exposure apparatus become slightly higher than the environmental air under the influence of various heat sources, a temperature gradient is formed in a boundary layer with an air layer (flow field) flowing around the metal members. Furthermore, since the air layer (flow field) is in a turbulent state, a temperature fluctuation of the air occurs. The temperature fluctuation of the air produced in the boundary layer is diffused throughout the blown air by convection. For this reason, even in the optical path of the laser interferometric measuring device, a temperature fluctuation of the air, and a fluctuation of the refractive index occur.

SUMMARY OF THE INVENTION

The present invention has been made in consideration of the above situation, and an object of the inventions to improve measurement precision by suppressing a variation in refractive index of a gas in an optical path in an optical measuring apparatus which is arranged in an environmental chamber together with a device having a high temperature.

An optical measuring apparatus according to the present invention comprises an environmental chamber which has a blowing opening to which a temperature-controlled gas is supplied from an external device, and an exhaust opening for exhausting the air outside the environmental chamber, a light-emitting unit which is arranged in the environmental chamber and irradiates a light beam onto an object to be measured set in the environmental chamber, a light-receiving unit which is arranged in the environmental chamber and detects the light beam reflected by the object to be measured, and a partitioning wall which is arranged to cover an optical path of the light beam.

The partitioning wall may be arranged on a portion in the optical path, which is near the light-emitting unit and the light-receiving unit. The area of the partitioning wall, which covers the optical path, may be determined on the basis of measurement precision required for the apparatus. Furthermore, a plurality of partitioning walls may be arranged in a stack.

A stage apparatus according to the present invention comprises an environmental chamber which has a blowing opening to which a temperature-controlled gas is supplied from an external device, and an exhaust opening for exhausting the air outside the environmental chamber, a stage which is arranged in the environmental chamber and is movable with respect to the environmental chamber, stage driving means for driving the stage, displacement detection means, arranged in the environmental chamber, for detecting displacement of the stage by irradiating a light beam onto the stage moved by the stage driving means, and detecting the light beam reflected by the stage, a high-temperature portion which is arranged in the environmental chamber, and has a temperature higher than the gas immediately after the gas is supplied from the blowing opening, and a partitioning wall arranged between the optical path of the light beam and the high-temperature portion.

The partitioning wall may be arranged on a portion in the optical path, which is near the light-emitting unit and the light-receiving unit. The area of the partitioning wall, which covers the optical path, may be determined on the basis of measurement precision required for the apparatus. Furthermore, a plurality of partitioning walls may be arranged in a stack.

According to the present invention, although the temperature of the gas which is supplied from the blowing opening and approaches or contacts the high-temperature portion increases, the entrance of the high-temperature gas into the optical path of the light beam by convection transportation is blocked by the partitioning wall. More specifically, although a temperature fluctuation of the gas occurs in a sub flow path, the temperature distribution of the gas in the main flow path is constant, and the distribution of the refractive index of the gas is also constant. Therefore, high-precision position measurement is realized.

When a plurality of partitioning walls are arranged, even when the temperature of the high-temperature portion is particularly high, the temperature distribution of the gas in the optical path of the light beam can be maintained constant.

According to the present invention, with a simple mechanism having only a partitioning wall, a temperature fluctuation of the gas produced in a boundary layer on the surface of the high-temperature portion can be blocked from flowing into the blown gas which passes the optical path of the optical measuring apparatus by convection transportation. For this reason, the variation (fluctuation) in refractive index caused by the temperature fluctuation of the gas in the optical path of the optical measuring apparatus can be suppressed to a sufficiently low level. Therefore, the measurement precision of various optical measuring apparatuses can be improved with low cost.

When a plurality of partitioning walls are arranged, the variation (fluctuation) in refractive index caused by the temperature fluctuation of the gas in the optical path of the optical measuring apparatus can be further suppressed, and a measurement error can be further reduced.

DESCRIPTION OF THE PREFERRED EMBODIMENTS

An embodiment of an optical measuring apparatus according to the present invention will be described below with reference to the accompanying drawings. In this embodiment, the present invention is applied to a laser interferometric measuring device for a semiconductor exposure apparatus arranged in an environmental chamber.

Figure 1:
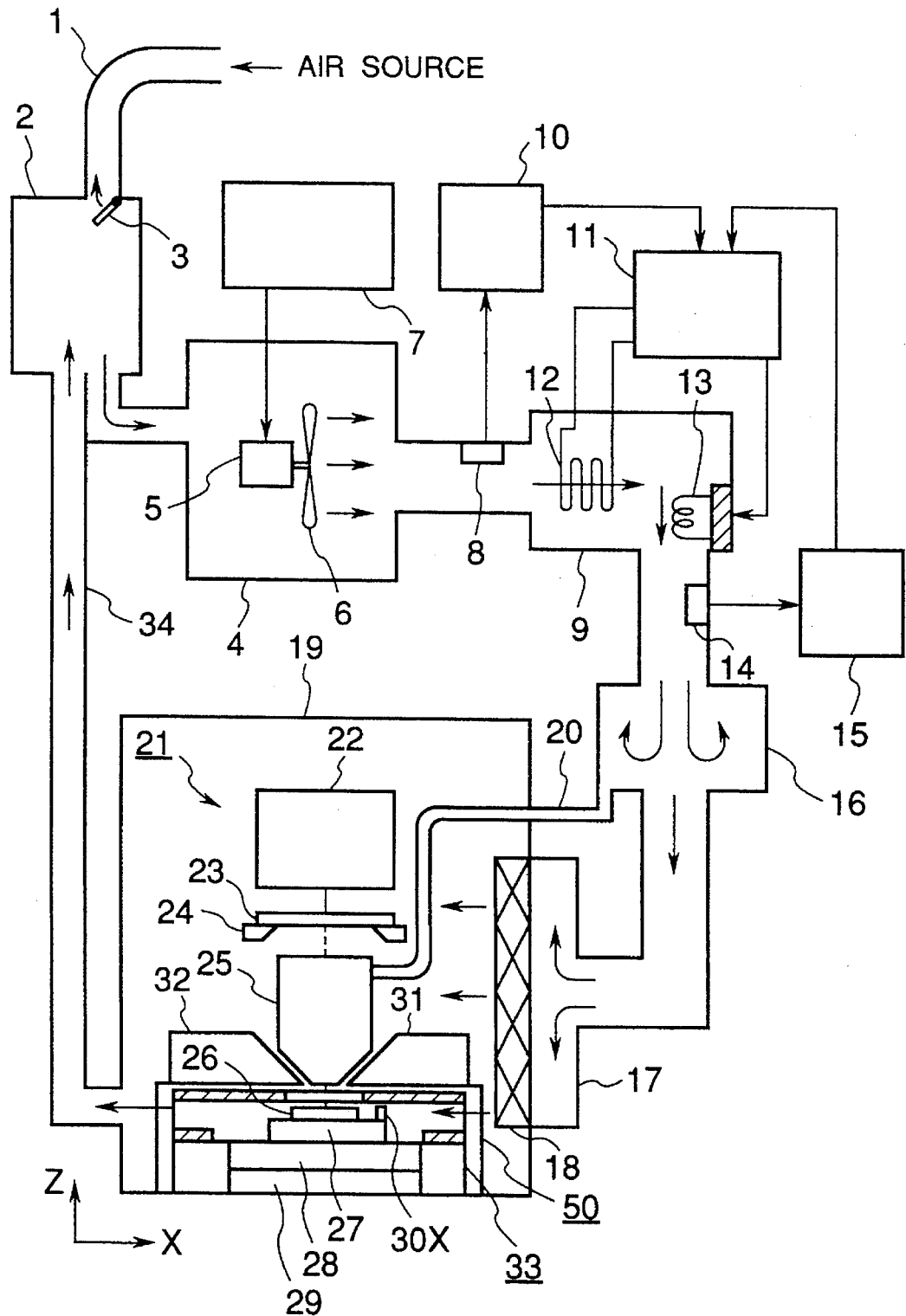
FIG. 1 is a block diagram showing an environmental chamber 19 which stores an optical measuring apparatus according to an embodiment of the present invention, and an air-conditioning mechanism.

FIG. 1 shows an environmental chamber and an air-conditioning mechanism of this embodiment. Referring to FIG. 1, a semiconductor exposure apparatus (projection exposure apparatus) 21 is arranged in an environmental chamber 19. In order to maintain the interior of the environmental chamber 19 at a constant temperature all the time, temperature-controlled and cleaned air is always supplied from the air-conditioning mechanism into the environmental chamber 19. The air in the environmental chamber 19 circulates while being controlled to have a slightly higher pressure than that of the outer air. Although the air in the environmental chamber 19 forms a closed loop in FIG. 1, many small opening portions are formed on, e.g., the side walls of the environmental chamber 19, in practice. However, the pressure of the air in the environmental chamber 19 is slightly higher than that of the outer air. For this reason, the air in the environmental chamber 19 leaks outside from these openings, but the amount of air which enters the environmental chamber 19 via these openings is negligible.

In the air-conditioning apparatus of this embodiment, an air source (not shown) supplies air having a pressure slightly higher than that of the air outside the environmental chamber 19 into an air chamber 2 via a pipe 1. In this case, a valve 3, which is free to open/close, is arranged at a connection opening between the pipe 1 and the air chamber 2, and the amount of air to be supplied into the air chamber 2 is adjusted by adjusting the opening/closing state of the valve 3. The air exhausted from the air chamber 2 reaches an air circulating chamber 4. In the air circulating chamber 4, a blower 5 for rotating blower blades 6 is arranged, and the circulating rate of the air in the environmental chamber 19 is maintained constant by controlling the operation of the blower 5 via an external adjustment device 7.

The air blown by the blower 5 reaches a temperature control chamber 9 via a connection pipe in which a temperature sensor 8 is arranged. A signal detected by the temperature sensor 8 is supplied to a measuring device 10. The measuring device 10 calculates the temperature of the air on the basis of the supplied signal, and this temperature information is supplied to a controller of an air compressor 11. In the temperature control chamber 9, a cooler 12 and a heater 13 are arranged, and the air compressor 11 controls the temperatures of the cooler 12 and the heater 13 to set the temperature of the air passing through the temperature control chamber 9 to be a desired temperature. The temperature-controlled air reaches a first diffusion chamber 16 via a connection pipe in which another temperature sensor 14 is arranged. A signal detected by the temperature sensor 14 is supplied to a measuring device 15. The measuring device 15 calculates the temperature of the air on the basis of the supplied signal, and this temperature information is supplied to the controller of the air compressor 11. The air compressor 11 controls the air in the temperature control chamber 9 by feedback control of the temperature detected by the temperature sensor 14.

The first diffusion chamber 16 diffuses the air so as not to form a nonuniform temperature distribution. The air passing through the first diffusion chamber 16 flows into a second diffusion chamber 17 for making uniform the supply of the air into the environmental chamber 19. The air supplied from the second diffusion chamber 17 is supplied into the environmental chamber 19 via an anti-dust HEPA filter 18. Furthermore, another pipe 20 extending from the first diffusion chamber 16 is connected to a projection optical system 25 (to be described later) in the semiconductor exposure apparatus 21 in the environmental chamber 19. This pipe is used for local air-conditioning (e.g., for forcibly changing the pressure of the air in a lens chamber between predetermined lens groups in the projection optical system 25).

The air in the environmental chamber 19 is returned to the air chamber 2 via a temperature control pipe 34 connected to the exhaust opening of the environmental chamber 19. As has already been described above, since the small openings are formed on, e.g., the side walls of the environmental chamber 19, not all of the air supplied into the environmental chamber 19 is returned to the air chamber 2 via the temperature control pipe 34.

In the semiconductor exposure apparatus 21 arranged in the environmental chamber 19, a reticle 23 held on a reticle stage 24 is illuminated with exposure light from an illumination optical system 22. Under the exposure light, a pattern on the reticle 23 is projected and exposed onto a wafer 26 coated with a photoresist via the projection optical system 25. A Z-axis is set in a direction parallel to the optical axis of the projection optical-system 25, an X-axis is set in a direction perpendicular to the Z-axis and parallel to the plane of the drawing of FIG. 1, and a Y-axis is set in a direction perpendicular to the plane of the drawing of FIG. 1. The wafer 26 is held on an X stage 27 for performing alignment in the X-direction, the X stage 27 is placed on a Y stage 28 for performing alignment in the Y direction, and the Y stage 28 is placed on a base 29. A movable mirror 30X for the X-axis and a movable mirror 30Y for the Y-axis (see FIG. 2) are fixed on the X stage 27. As will be described later, the X- and Y-coordinates of the X stage 27 and the wafer 26 are always measured using the laser interferometric measuring device. The wafer 26 is aligned on the basis of the measurement result.

An off-axis type alignment system 31 for detecting the positions of alignment marks on the wafer 26 is arranged on one portion of a side surface portion of the projection optical system 25. A focus/leveling sensor unit 32 for detecting the focus position and inclination angle of the exposure surface of the wafer 26 is arranged on the other portion of the side wall portion. The focus/leveling sensor unit 32 irradiates a light beam onto the exposure surface of the wafer 26 obliquely with respect to the optical axis of the projection optical system 25, and detects the focus position and inclination angle on the basis of a position shift of reflected light. On the other hand, the alignment system 31 picks up images of alignment marks, and detects the positions of the alignment marks by an image processing method. As the alignment system 31, a so-called two-beam interference type alignment system which irradiates laser beams onto alignment marks from two directions and detects the positions using interference light of light beams diffracted by the alignment marks, may be used. The off-axis type alignment system 31 and the focus/leveling sensor unit 32 are arranged on a frame 50.

In this case, since exposure light is transmitted through the interior of the projection optical system 25 during exposure, the temperature of the projection optical system 25 tends to increase. The temperatures of the alignment system 31 and the focus/leveling sensor unit 32 also gradually rise due to heat radiated from the projection optical system 25. Furthermore, since the alignment system 31 has a heat source, such as a light source for illumination, and the focus/leveling sensor, unit 32 also has a heat source such as a light source for detection light, the temperatures of the projection optical system 25, the alignment system 31, and the focus/leveling sensor unit 32 become considerably higher than the temperature of the air immediately after the air is blown from the HEPA filter 18 into the environmental chamber 19. Similarly, a high-temperature device is arranged in the side surface direction, in the Y direction, of the X stage 27. For this reason, the refractive index of the air varies due to the temperature fluctuation of the air in the optical path of the laser beam of the laser interferometric measuring device, and an error is included in the coordinate measurement value of the wafer 26 unless a countermeasure is taken.

In this embodiment, in order to prevent the temperature fluctuation of the air in the optical path of the laser beam of the laser interferometric measuring device, a cover 33 for covering the optical path of the laser beam of the laser interferometric measuring device is arranged. The frame 50 is arranged around the cover 33, and the off-axis type alignment system 31 and the focus/leveling sensor unit 32 are arranged on the frame 50.

Figure 2:
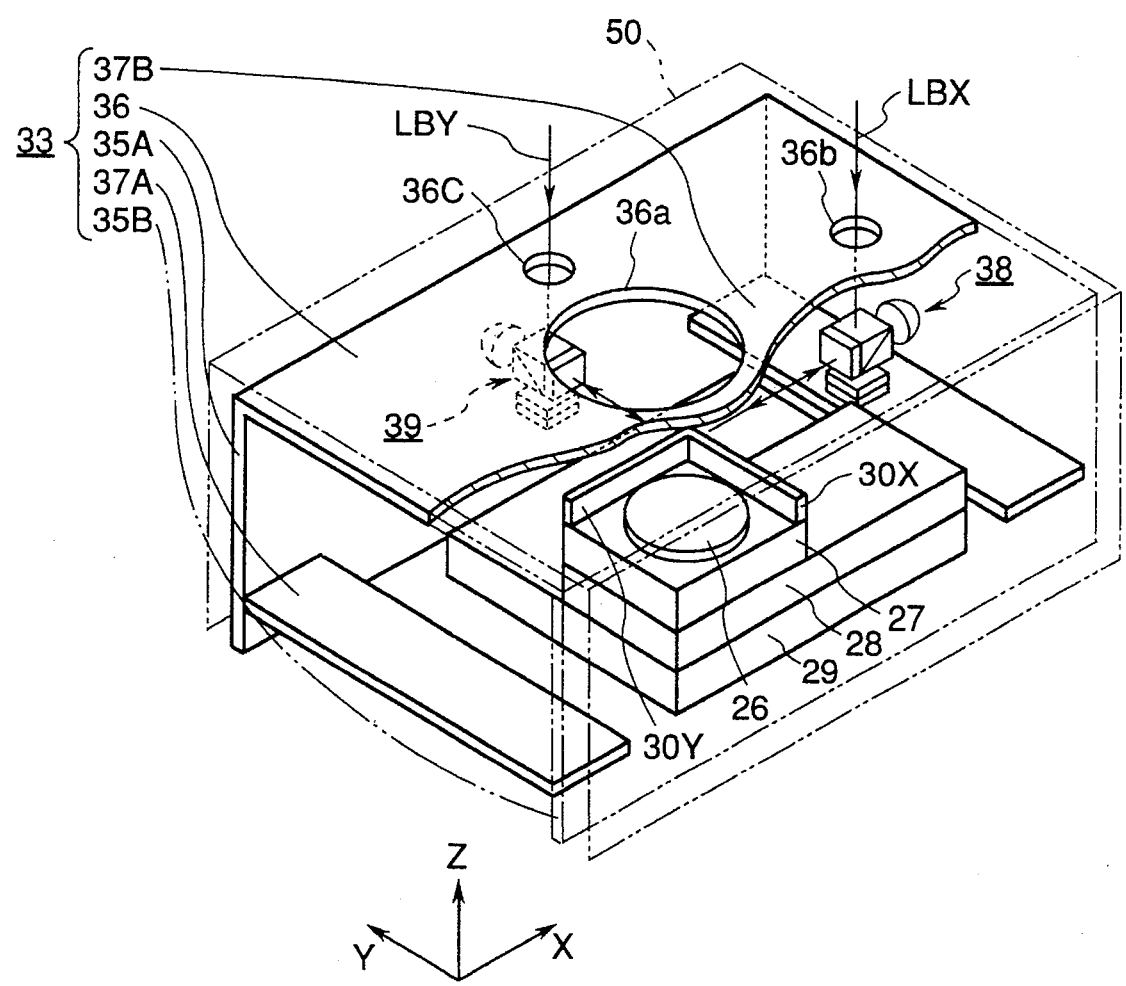
FIG. 2 is a partially cutaway perspective view showing a cover of the optical path of a laser interferometric measuring device of the embodiment shown in FIG. 1.

FIG. 2 shows the arrangement of the stage mechanism of the wafer 26, the laser interferometric measuring device, and the cover 33 in this embodiment. Referring to FIG. 2, the cover 33 is constituted by fixing a top plate (a partitioning wall of the present invention) 36 between the upper ends of side plates 35A and 35B parallel to the X-Z plane to extend in a direction parallel to the X-Y plane, and fixing two bottom plates 37A and 37B to the two end portions, in the X-direction, near the lower ends of the side plates 35A and 35B to extend in a direction parallel to the X-Y plane. The cover 33 consists of, e.g., a metal plate, such as an aluminum plate, a stainless steel plate, or the like, a synthetic resin plate, or the like.

The cover 33 is attached, so that the stage mechanism consisting of the base 29, the Y stage 28, and the X stage 27 is stored between the bottom plates 37A and 37B of the cover 33. A large circular opening 36a is formed at the center of the top plate 36 of the cover 33. A pattern image on the reticle is projected onto the wafer 26 via the opening 36a, and a light beam emitted from the alignment system or the focus/leveling sensor unit is irradiated onto the wafer. A laser beam LBX is incident from an external device into the cover 33 via a small opening 36b formed on the end portion, in the X-direction, of the top plate 36. The laser beam LBX is guided to an interference optical system 38 for the X-axis. The laser beam split by the interference optical system 38 is irradiated onto a movable mirror 30X for the X-axis in a direction parallel to the X-axis, and the laser beam reflected by the movable mirror 30X returns to the interference optical system 38. The interference optical system 38 outputs a measurement signal, which changes in correspondence with the displacement of the movable mirror 30X.

Similarly, a laser beam LBY is incident from an external device into the cover 33 via a small opening 36c formed on the end portion, in the Y-direction, of the top plate 36. The laser beam LBX is guided to an interference optical system 39 for the Y-axis. The laser beam split by the interference optical system 39 is irradiated onto a movable mirror 30Y for the Y-axis in a direction parallel to the Y-axis, and the laser beam reflected by the movable mirror 30Y returns to the interference optical system 39. The interference optical system 39 has the same arrangement as that of the interference optical system 38, and outputs a measurement signal which changes in correspondence with the displacement of the movable mirror 30Y. Around the cover 33, the alignment system 31 and the focus/leveling sensor unit 32 arranged on the frame 50 indicated by an alternate long and two short dashed line in FIG. 2, and high-temperature members including heat sources of the projection optical system 25 and the like are arranged. The frame 50 has openings for allowing exposure light, beams from the interference optical systems 38 and 39, a light beam from the alignment system 31, and a light beam from the focus/leveling sensor unit 32 to pass therethrough.

Figure 3:
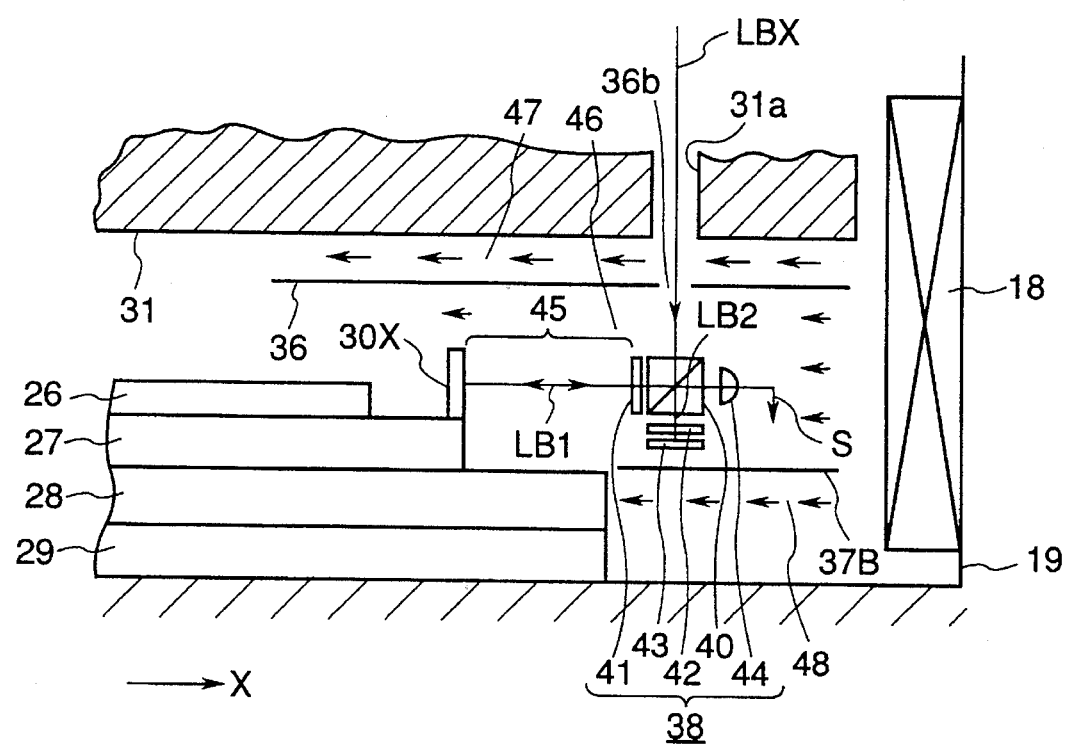
FIG. 3 is an enlarged sectional view showing in detail the structure near an interference optical system 38 for the X axis shown in FIG. 2.

FIG. 3 shows the detailed arrangement of the interference optical system 38 for the X-axis. Referring to FIG. 3, the laser beam LBX incident via an opening 31a in the alignment system 31 and the opening 36b of the top plate 36 is incident on a polarization beam splitter 40. The laser beam LBX consists of laser beams LB1 and LB2, which have a slight frequency difference therebetween, and the laser beams LB1 and LB2 are respectively s- and p-polarized light beams with respect to the polarization beam splitter 40. The laser beam LB1 is reflected by the polarization beam splitter 40, and thereafter, propagates toward the movable mirror 30X along an optical path 45 via a quarter wave plate 41. The laser beam LB1 reflected by the movable mirror 30X is transmitted through the polarization beam splitter 40 in a p-polarized state via the quarter wave plate 41, and is then incident on a photoelectric detector 44.

On the other hand, the laser beam LB2 is transmitted through the polarization beam splitter 40, and thereafter, propagates toward a reference mirror 43 via a quarter wave plate 42. The laser beam LB2, reflected by the reference mirror 43, is reflected by the polarization beam splitter 40 in an s-polarized state via the quarter wave plate 42, and is incident on the photoelectric detector 44. The relative displacement amount of the movable mirror 30X with reference to the reference mirror 43 is detected on the basis of a beat signal S obtained by photoelectrically converting interference light of the two laser beams LB1 and LB2 incident on the photoelectric detector 44. Note that the HEPA filter 18 is arranged behind the photoelectric detector 44 in the interference optical system 38 for the X-axis. The air blown from the HEPA filter 18 flows from the photoelectric detector 44 in the direction of the movable mirror 30X. The bottom plate 37B is arranged below the interference optical system 38.

The effect of the cover 33 of this embodiment will be described below with reference to FIG. 3. Referring to FIG. 3, the temperature-controlled air blown from the HEPA filter 18 flows in a −X-direction while being divided into a sub flow path 47 between the alignment system 31 and the top plate 36, which is a portion of the cover 33, a main flow path 46 which surrounds the optical path 45 of the laser beam LB1 between the top plate 36 and the bottom plate 37B, and a sub flow path 48 between the bottom plate 37B and the floor surface of the environmental chamber 19. In this case, in the upper sub flow path 47, since the temperature of the air which approaches or contacts the high-temperature alignment system 31 rises, and convection of the air occurs, the temperature of the air in the sub flow path 47 varies. Similarly, when the temperature outside the environmental chamber 19 is high, the temperature of the air varies as well in the lower sub flow path 48.

In contrast to this, in the main flow path 46 surrounded by the top plate 36 and the bottom plate 37B (furthermore, the side plates 35A and 35B in FIG. 2), no high-temperature members are present, and the air heated by, e.g., the alignment system 31 or the like does not flow in. For this reason, a uniform temperature distribution of the air is maintained. Therefore, in the optical path 45 of the laser beam LB1 in the main flow path 46, since the temperature variation of the air is very small, and the variation in refractive index of the air is very small, the measurement error of the coordinates of the movable mirror 30X is very small. Similarly, in the interference optical system 39 for the Y-axis shown in FIG. 2 as well, since the variation in temperature of the air in the main flow path is small, the measurement error is minimized.

In this embodiment, as shown in FIG. 2, the cover 33 is arranged to face almost the entire surface of a structural body (e.g., the alignment system 31) as a heat source, but need not always cover the entire surface. More specifically, when the cover 33 is arranged at only the upstream side of the optical path of the laser beam of the laser interferometric measuring device, the temperature variation of the air in the main flow path can be considerably reduced. The cover 33 need not always completely cover a predetermined portion of the surface of the structural body as a heat source. Since the degree of suppression of the temperature variation of-the air is determined in correspondence with the covering area, the area to be covered by the cover 33 is determined in correspondence with the temperature variation of the air, which is determined by the measurement precision required for the apparatus.

For example, in FIG. 3, the interval between the top plate 36 and the surface of the high-temperature alignment system 31, i.e., the width of the sub flow path 47 is preferably set to be larger than the thickness of an expected temperature boundary layer. When the flow of the air in the sub flow path 47 is a turbulent flow, the thickness of the temperature boundary layer cannot be analytically calculated. However, in such a case, since the thickness of the temperature boundary layer can be calculated by numeric calculations using versatile thermal fluid analysis codes, it can be utilized.

As shown in FIG. 1, since the temperature variation of the air in the cover 33 becomes small, a light beam from the alignment system 31 (especially, in the two-beam interference type), and a light beam from the focus/leveling sensor unit 32 are stabilized, and the measurement precision can be improved. Therefore, the alignment system 31 and the focus/leveling sensor unit 32 are also a kind of optical measuring apparatus of the present invention. The present invention can also be applied to, e.g., a reticle coordinate measuring machine, and the like.

As described above, the present invention is not limited to the above embodiments, and may adopt various other arrangements without departing from the scope of the present invention.

What is claimed is:

1. An optical position measuring apparatus, comprising:
   an environmental chamber which has a blowing opening through which a temperature-controlled gas is supplied from an external device into said environmental chamber, and an exhaust opening for exhausting the gas outside said environmental chamber;
   a light-emitting unit for irradiating a light beam onto an object to be measured arranged in said environmental chamber;

a light-receiving unit for receiving the light beam reflected by said object and outputting a signal corresponding to a position of said object;

a heat source which is arranged in said environmental chamber and forms a gas layer having a temperature higher than a temperature of gas being supplied from the blowing opening into said environmental chamber; and a partitioning wall which is arranged between an optical path of the light beam and said heat source to divide gas supplied from said blowing opening into a first flow path containing said optical path of the light beam and a second flow path containing said heat source.

2. An apparatus according to claim 1, including a second partitioning wall arranged between said optical path of the light beam and a wall of the environmental chamber to divide gas supplied from said blowing opening into said first flow path and a third flow path between said second partitioning wall and said wall of said environmental chamber.

3. An apparatus according to claim 1, wherein said partitioning wall is arranged near said blowing opening.

4. An apparatus according to claim 1, wherein an area of said partitioning wall is determined on the basis of measurement precision required for said apparatus.

5. An apparatus according to claim 1, including a plurality of partitioning walls arranged in a stack.

6. A stage apparatus, comprising:

an environmental chamber which has a blowing opening through which a temperature-controlled gas is supplied from an external device into said environmental chamber, and an exhaust opening for exhausting the gas outside said environmental chamber;

a two-dimensionally movable stage arranged in said environmental chamber;

stage driving means for driving said stage;

displacement detection means, arranged in said environmental chamber, for detecting a displacement of said stage by irradiating a light beam onto said stage moved by said stage driving means and detecting the light beam reflected by said stage;

a heat source which is arranged in said environmental chamber and forms a gas layer having a temperature higher than a temperature of gas being supplied from the blowing opening into the environmental chamber; and a partitioning wall which is arranged between an optical path of the light beam and said heat source to cover said optical path of the light beam and said stage and to divide gas supplied from said blowing opening into a first flow path containing said optical path of the light beam and a second flow path containing said heat source.

7. An apparatus according to claim 6, including a second partitioning wall arranged between said optical path of the light beam and a wall of the environmental chamber to divide gas supplied from said blowing opening into said first flow path and a third flow path between said second partitioning wall and said wall of said environmental chamber, wherein gas flowing in said first flow path and gas flowing in said second flow path flow in one direction above said optical path of the light beam and said stage.

8. An apparatus according to claim 6, wherein said partitioning wall is arranged on a portion, near said blowing opening, above the optical path of the light beam and said stage.

9. An apparatus according to claim 6, wherein an area of said partitioning wall that covers said optical path of the light beam and said stage is determined based on measurement precision required for said apparatus.

10. An apparatus according to claim 6, including a plurality of partitioning walls arranged in a stack.

11. A projection exposure apparatus, comprising:

an environmental chamber which has a blowing opening through which a temperature-controlled gas is supplied from an external device into said environmental chamber, and an exhaust opening for exhausting the gas outside said environmental chamber;

a heat source which is arranged in said environmental chamber and forms a gas layer having a temperature higher than a temperature of gas being supplied from the blowing opening into said environmental chamber;

a stage which is arranged in said environmental chamber and is movable with respect to said environmental chamber;

displacement detection means for detecting a displacement of said stage by irradiating a light beam onto said stage and detecting the light beam reflected by said stage; and a partitioning wall which is arranged between an optical path of the light beam and said heat source to cover said optical path of the light beam and said stage and to divide gas supplied from said blowing opening into a first flow path containing said optical path of the light beam and a second flow path containing said heat source.

12. An apparatus according to claim 11, wherein said heat source comprises one of a projection optical system, an alignment system, and a focus/leveling sensor.

13. An apparatus according to claim 11, including a second partitioning wall arranged between said optical path of the light beam and a wall of the environmental chamber to divide gas supplied from said blowing opening into said first flow path and a third flow path between said second partitioning wall and said wall of said environmental chamber.

14. An apparatus according to claim 11, wherein said partitioning wall is arranged on a portion, near said blowing opening, above the optical path of the light beam and said stage.

15. An apparatus according to claim 11, wherein an area of said partitioning wall, that covers the optical path of the light beam and said stage is determined based on measurement precision required for said apparatus.

16. An apparatus according to claim 11, wherein a distance, between said optical path, and said partitioning wall is determined based on a temperature distribution between said optical path and said heat source.

17. An apparatus according to claim 11, including a plurality of partitioning walls arranged in a stack.

* * * * *